(12) United States Patent
Ikeda et al.

(10) Patent No.: US 6,936,487 B2
(45) Date of Patent: Aug. 30, 2005

(54) SEMICONDUCTOR DEVICE WITH OHMIC ELECTRODE FORMED ON COMPOUND SEMICONDUCTOR HAVING WIDE BAND GAP AND ITS MANUFACTURE METHOD

(75) Inventors: Keiji Ikeda, Kawasaki (JP); Yoshimi Yamashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 55 days.

(21) Appl. No.: 10/429,828

(22) Filed: May 6, 2003

(65) Prior Publication Data
US 2003/0209715 A1 Nov. 13, 2003

(30) Foreign Application Priority Data
May 8, 2002 (JP) ........................................ 2002-133056

(51) Int. Cl.⁷ .............................................. H01L 21/00
(52) U.S. Cl. ............................ 438/22; 438/24; 438/46
(58) Field of Search ................................. 257/582, 583, 257/655, 656, 664, 682; 438/22, 24, 46

(56) References Cited

U.S. PATENT DOCUMENTS

| | | | |
|---|---|---|---|
| 4,692,348 A | * | 9/1987 | Rubloff et al. .............. 438/558 |
| 6,323,053 B1 | * | 11/2001 | Nishikawa et al. ........... 438/46 |
| 6,750,124 B1 | * | 6/2004 | Mitan et al. ................ 438/583 |

* cited by examiner

*Primary Examiner*—Long Pham
*Assistant Examiner*—Wai-Sing Louie
(74) *Attorney, Agent, or Firm*—Westerman, Hattori, Daniels and Adrian LLP

(57) ABSTRACT

A first film of rare-earth metal is formed on a semiconductor region of compound semiconductor exposed on a substrate. A second film essentially comprising silicon is formed on the surface of the first film. The first and second films are heated to silicidate at least a portion of the first film in contact with the second film. It is possible to lower the contact resistance of an ohmic electrode formed on semiconductor having a wide band gap.

12 Claims, 7 Drawing Sheets

SEMICONDUCTOR DEVICE WITH OHMIC ELECTRODE FORMED ON COMPOUND SEMICONDUCTOR HAVING WIDE BAND GAP AND ITS MANUFACTURE METHOD

CROSS REFERENCE TO RELATED APPLICATION

This application is based on Japanese Patent Application No. 2002-133056, filed on May 8, 2002, the entire contents of which are incorporated herein by reference.

BACKGROUND OF THE INVENTION

1) Field of the Invention

The present invention relates to a semiconductor device and its manufacture method, and more particularly to a semiconductor device having an ohmic electrode formed on compound semiconductor having a wide band gap and its manufacture method.

2) Description of the Related Art

As an ohmic electrode for semiconductor having a wide band gap such as gallium nitride (GaN), a laminated electrode of titanium (Ti) and aluminum (Al) has been used conventionally. After the laminated electrode of Ti (lower layer)/Al (upper layer) is vapor-deposited on the surface of GaN, rapid thermal annealing (RTA) is performed to form ohmic contact. With RTA, a surface oxide layer slightly left on the surface of GaN is thermally destructed so that recombination centers are formed at a boundary between metal and semiconductor. Carriers are transported via recombination centers so that ohmic contact can be obtained.

As the impurity concentration of GaN is raised, a depletion layer formed in the surface layer of GaN becomes thin. As the depletion layer becomes thin, tunneling current can be increased in addition to hot electron field emission by which carriers are transported over the potential barrier at the junction. In this manner, ohmic contact with a small contact resistance can be formed.

The current-voltage characteristics at the junction between semiconductor and metal are determined by electron affinity, band gap, impurity concentration, respectively of semiconductor, work function of metal and the like. As metal is made in contact with semiconductor, there is a general tendency that the Fermi level of metal is pinned in the band gap of semiconductor. As metal is made in contact with semiconductor having a wide band gap such as GaN, the Schottky barrier at the junction between metal and semiconductor becomes high. From this reason, there is a limit in reducing contact resistance.

In forming ohmic contact on GaN, it is necessary to perform annealing at a high temperature of about 600 to 800° C. after a Ti electrode is formed, because oxygen left on the surface of GaN is strongly coupled to Ga.

SUMMARY OF THE INVENTION

An object of this invention is to provide a semiconductor device capable of lowering contact resistance of an ohmic electrode formed on semiconductor having a wide band gap, and its manufacture method.

According to one aspect of the present invention, there is provided a method of manufacturing a semiconductor device, comprising steps of: forming a first film of rare-earth metal on a semiconductor region of compound semiconductor exposed on a substrate; forming a second film essentially comprising silicon on a surface of the first film; and heating the first and second films to silicidate at least a portion of the first film in contact with the second film.

The first film in contact with the semiconductor region is made of rare-earth metal or its silicide. An ohmic contact having a low contact resistance can be formed on compound semiconductor having a wide band gap.

According to another aspect of the present invention, there is provided a semiconductor device comprising: a substrate having a semiconductor region of compound semiconductor formed in a surface layer of the substrate; and a first film of rare-earth metal directly disposed on a surface of the semiconductor region.

According to another aspect of the present invention, there is provided a semiconductor device comprising: a substrate having a semiconductor region of compound semiconductor formed in a surface layer of the substrate; and a first film of silicide of rare-earth metal directly disposed on a surface of the semiconductor region.

By making the first film made of rare-earth metal or its silicide contact the semiconductor region, an ohmic contact having a low contact resistance can be formed on compound semiconductor having a wide band gap.

DESCRIPTION OF THE PREFERRED EMBODIMENTS

Figure 1A:
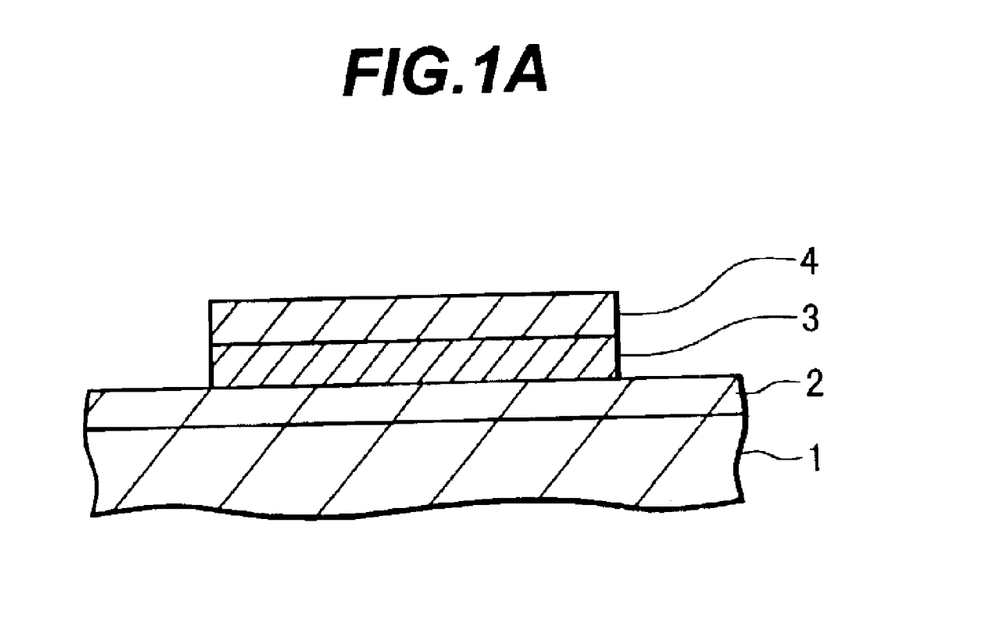
FIGS. 1A and 1B are cross sectional views of a substrate illustrating a method of manufacturing a semiconductor device according to a first embodiment.
Figure 1B:
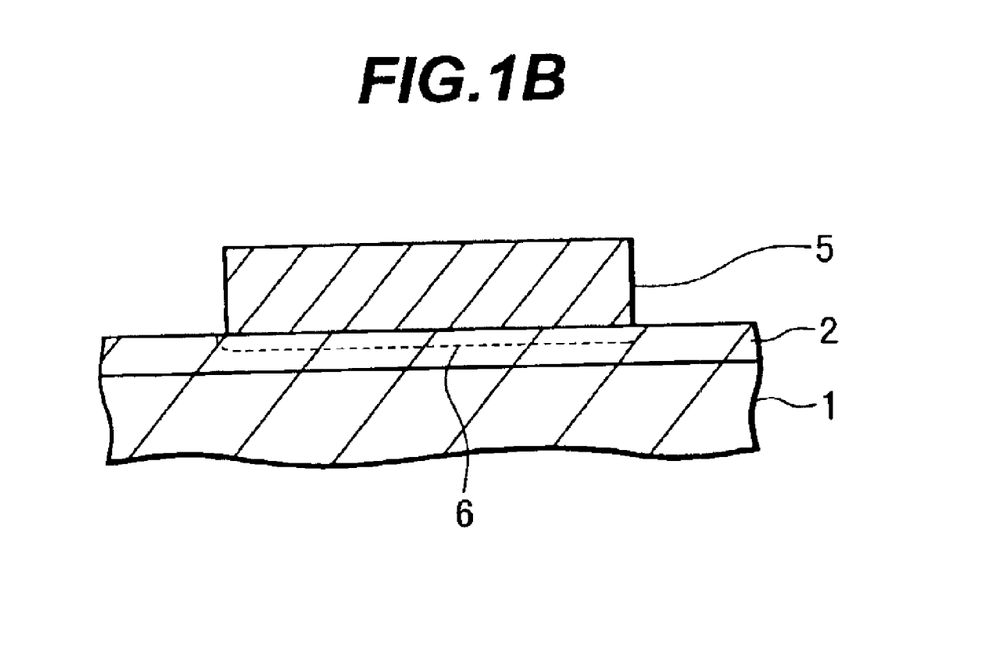

With reference to FIGS. 1A and 1B, description will be made on a semiconductor device and its manufacture method according to the first embodiment of the invention.

As shown in FIG. 1A, a semiconductor layer 2 of compound semiconductor is formed on a semiconductor substrate 1. The semiconductor layer 2 is made of group III–V compound semiconductor containing nitrogen as a group V element, such as gallium nitride (GaN). In addition to GaN, group III–V compound semiconductor containing nitrogen includes InGaN, AlGaN, InN, GaInNAs, InAlNAs, AlN and the like. These compound semiconductor materials have a wide band gap as compared to those compound semiconductor materials which contain P, As, Sb or the like as the group V element and do not contain N. The embodiments to follow are effective for the semiconductor layer 2 made of compound semiconductor having a wide band gap, among others compound semiconductor having a band gap equal to or wider than 3 eV.

A metal layer 3 made of erbium (Er) is formed on the semiconductor layer 2. The metal layer 3 can be formed in a high vacuum state of about $1\times10^{-7}$ to $1\times10^{-8}$ Pa by electron beam deposition, crucible heating deposition, sputtering or the like. Oxidation of erbium can be prevented by setting a film forming atmosphere to the high vacuum state of about $1\times10^{-7}$ to $1\times10^{-8}$ Pa.

A silicon layer 4 is formed on the metal layer 3. The silicon layer 4 can be formed in a vacuum state of about $1\times10^{-5}$ to $1\times10^{-6}$ Pa by electron beam deposition, crucible heating deposition, sputtering or the like.

The surface of the silicon layer 4 is covered with a resist patter, and by using this resist pattern as a mask, the silicon layer 4 and metal layer 3 are etched. For example, the silicon layer 4 is dry-etched by using $SF_6$ and $O_2$, and the metal layer 3 is dry-etched by using Ar.

Heat treatment is performed in a vacuum state of about $1\times10^{-5}$ to $1\times10^{-6}$ Pa and at a temperature of about 300 to 400° C. With this heat treatment, a suicide reaction occurs between the metal layer 3 and silicon layer 4. By using amorphous silicon as the material of the silicon layer 4, the silicide reaction occurs at a low temperature of 400° C. or lower. Since the suicide reaction is conducted in the vacuum state, oxidation of the metal layer 3 can be prevented. The heat treatment for the silicide reaction may be performed in an inert gas atmosphere.

As shown in FIG. 1B, an ohmic electrode 5 of silicide of rare-earth metal is therefore formed on the semiconductor layer 2. In addition, silicon in the ohmic electrode 5 diffuses into the surface layer of the semiconductor layer 2 so that a high concentration silicon region 6 is formed.

Figure 3A:
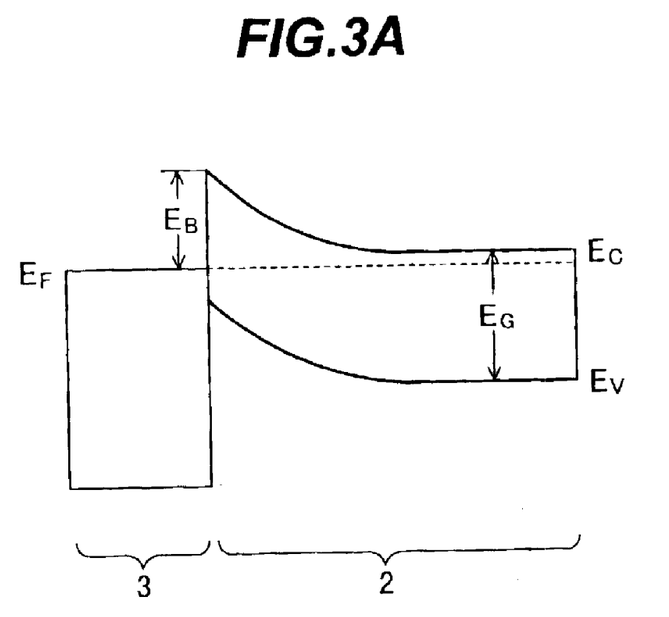
FIGS. 3A and 3B are energy band diagrams near at the interface between a semiconductor layer and a metal layer of the semiconductor device of the first embodiment.

FIG. 3A is an energy band diagram before silicidation shown in FIG. 1A. The band gap $E_C$ of the semiconductor layer 2 of GaN is 3.4 eV. At the interface between the semiconductor layer 2 and metal layer 3, a potential barrier $E_B$ is formed corresponding to a difference between electron affinity of GaN and the work function of erbium. $E_F$, $E_C$ and $E_V$ shown in FIGS. 3A and 3B represent the Fermi level, the level at the lower end of the conduction band and the level at the upper end of the valence band, respectively.

The work function (3.25 eV) of erbium is smaller than the work function (4.33 eV) of titanium. The potential barrier $E_B$ can be made lower than when a titanium electrode is made in contact with GaN. Hot electron field emission becomes large and low resistance contact can be obtained. Even in the state before silicidation shown in FIG. 1A, contact resistance can be lowered more than a conventional ohmic electrode structure. Even if only a region of the metal layer 3 in contact with the silicon layer 4 is silicidated and a region in contact with the semiconductor layer 2 is not silicidated, the energy band structure similar to that shown in FIG. 3A can be obtained. The metal layer 3 may be made of rare-earth metal other than Er, such as gadolinium (Gd) having a work function of 3.15 eV, terbium (Tb) having a work function of 3.0 eV and holmium (Ho) having a work function of 3.15 eV.

Rare-earth metal is rich in reaction and likely to be oxidized. Because oxide of rare-earth metal is an insulator, rare-earth metal has been considered not suitable for the electrode material. In this embodiment, as shown in FIG. 1A, the metal layer 3 made of rare-earth metal is covered with the silicon layer 4 so that oxidation of the metal layer 3 can be prevented.

Figure 3B:
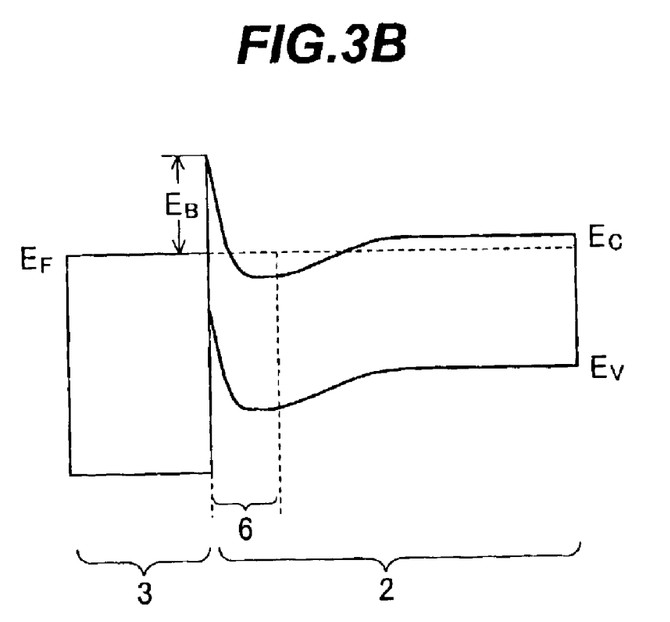

FIG. 3B is an energy band diagram after silicidation shown in FIG. 1B. The height of the potential barrier $E_B$ at the interface between the semiconductor layer 2 and metal layer 3 does not change from that before silicidation. Since the high concentration silicon region 6 is formed in the surface layer of the semiconductor layer 2, the depletion layer extending from the interface into the inside of the semiconductor layer 2 becomes thin. Therefore, even electrons having energy equal to or smaller than the potential barrier $E_B$ are transported from the semiconductor layer 2 to the metal layer 3 or vice versa by the tunneling phenomenon. The contact resistance can therefore be lowered further.

The contact resistance when a titanium electrode was formed on a GaN layer was 5 to $8\times10^{-6}$ $\Omega cm^2$, whereas the contact resistance when an erbium (Er) silicide electrode was formed on a GaN layer was $2\times10^{-6}$ $\Omega cm^2$.

In the first embodiment, after the laminated structure of the metal layer 3 of rare-earth metal and the silicon layer 4 is formed, the silicide reaction is performed. Instead, rare-earth metal and silicon may be vapor-deposited at the same time by using two crucibles. In this case, at the same time when the film is formed, the ohmic electrode 5 made of silicide of rare-earth metal can be formed.

If a conventional titanium electrode is used, the surface of GaN is required to be processed by hydrochloric acid, hydrofluoric acid, potassium hydroxide or the like before the titanium film is formed. In contrast, in the first embodiment, the surface treatment of the semiconductor layer 2 by such chemicals is not required to be performed before the metal layer 3 of erbium is formed.

Figure 2A:
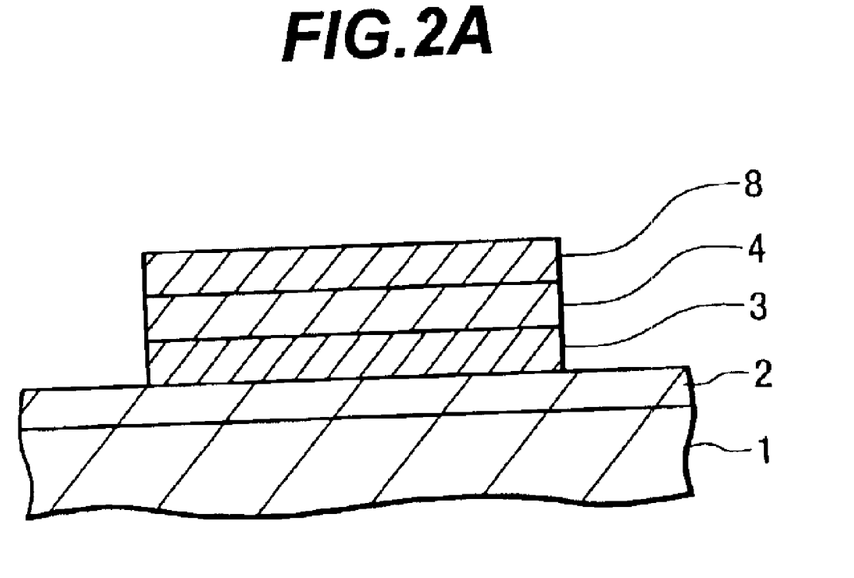
FIGS. 2A and 2B are cross sectional views of a substrate illustrating a method of manufacturing a semiconductor device according to a second embodiment.
Figure 2B:
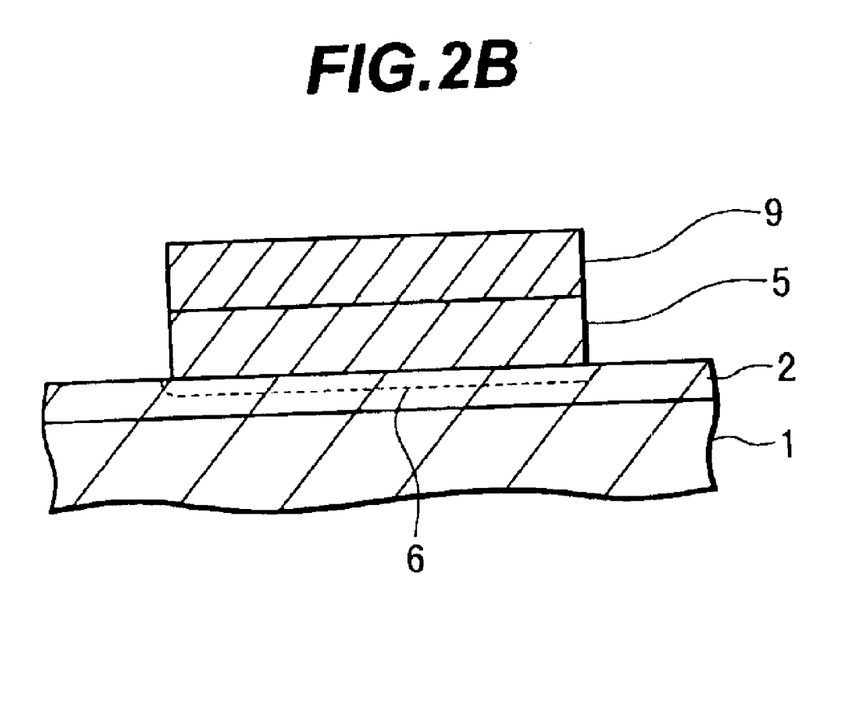

With reference to FIGS. 2A and 2B, description will be made on a semiconductor device and its manufacture method according to the second embodiment of the invention.

On a substrate 1, a semiconductor layer 2, a metal layer 3 and a silicon film 4 are sequentially formed. The processes up to this state are similar to the processes of the first embodiment described with reference to FIG. 1A. On the silicon layer 4, an upper metal layer 8 of titanium is formed. The upper metal layer 8 can be formed by electron beam deposition, crucible heating deposition, sputtering or the like.

The surface of the upper metal layer 8 is covered with a resist pattern, and by using this resist pattern as a mask, the upper metal layer 8, silicon layer 4 and metal layer 3 are etched. Thereafter, heat treatment is performed in a vacuum state to conduct a silicide reaction.

As shown in FIG. 2B, an ohmic electrode 5 is therefore formed by the silicide reaction between the metal layer 3 and silicon layer 4, and on this ohmic electrode 5 a cover layer 9 is formed which is made of titanium silicide ($TiSi_2$) formed through silicidation of the upper metal layer 8. A high concentration silicon region 6 is formed in the surface layer of the semiconductor layer 2.

The resistivity of titanium silicide is lower than that of erbium silicide. Therefore, not only the contact resistance but also the resistance of an electronic circuit constituted of ohmic electrodes 5 can be lowered. In the second embodiment, although titanium is used as the material of the upper metal layer 8, other metals may also be used which are silicidated with silicon to form metal suicide having a resistivity lower than that of the ohmic electrode 5. Such metals may be cobalt (Co), nickel (Ni), platinum (Pt) or the like.

Next, various semiconductor devices will be described which incorporate the ohmic electrode structure of the first or second embodiment.

Figure 4:
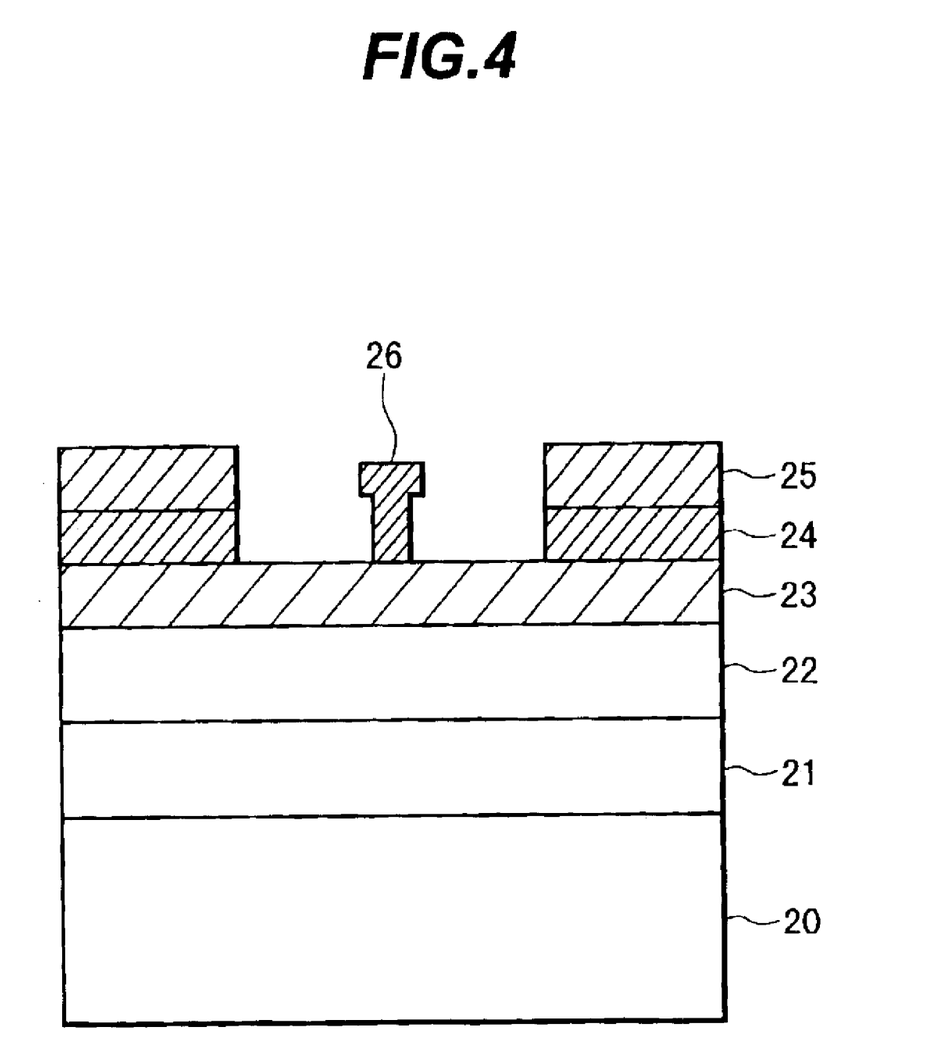
FIG. 4 is a cross sectional view of a MESFET having the structure of the semiconductor device of the second embodiment.

FIG. 4 is a cross sectional view of a MESFET. On a substrate 20 made of sapphire (Al$_2$O$_3$) or silicon carbide (SiC), a buffer layer 21 of GaN, an underlying layer 22 of undoped GaN and a channel layer 23 of n-type GaN are sequentially formed.

A gate electrode 26 having a two-layer structure of Pt (lower layer)/Au (upper layer) or a two-layer structure of Ni (lower layer)/Au (upper layer) is in Schottky contact with a partial surface area of the channel layer 23. Ohmic electrodes 24 made of erbium silicide are formed on the channel layer 23 on both sides of and spaced apart from the gate electrode 26. On each of the ohmic electrodes 24, a cover film 25 of titanium silicide is formed.

The channel layer 23, ohmic electrode 24 and cover layer 25 correspond to the semiconductor layer 2, ohmic electrode 5 and cover layer 9 shown in FIG. 2B. In MESFET shown in FIG. 4, the contact resistance between the ohmic electrode 24 and channel layer 23 can be lowered.

Figure 5:
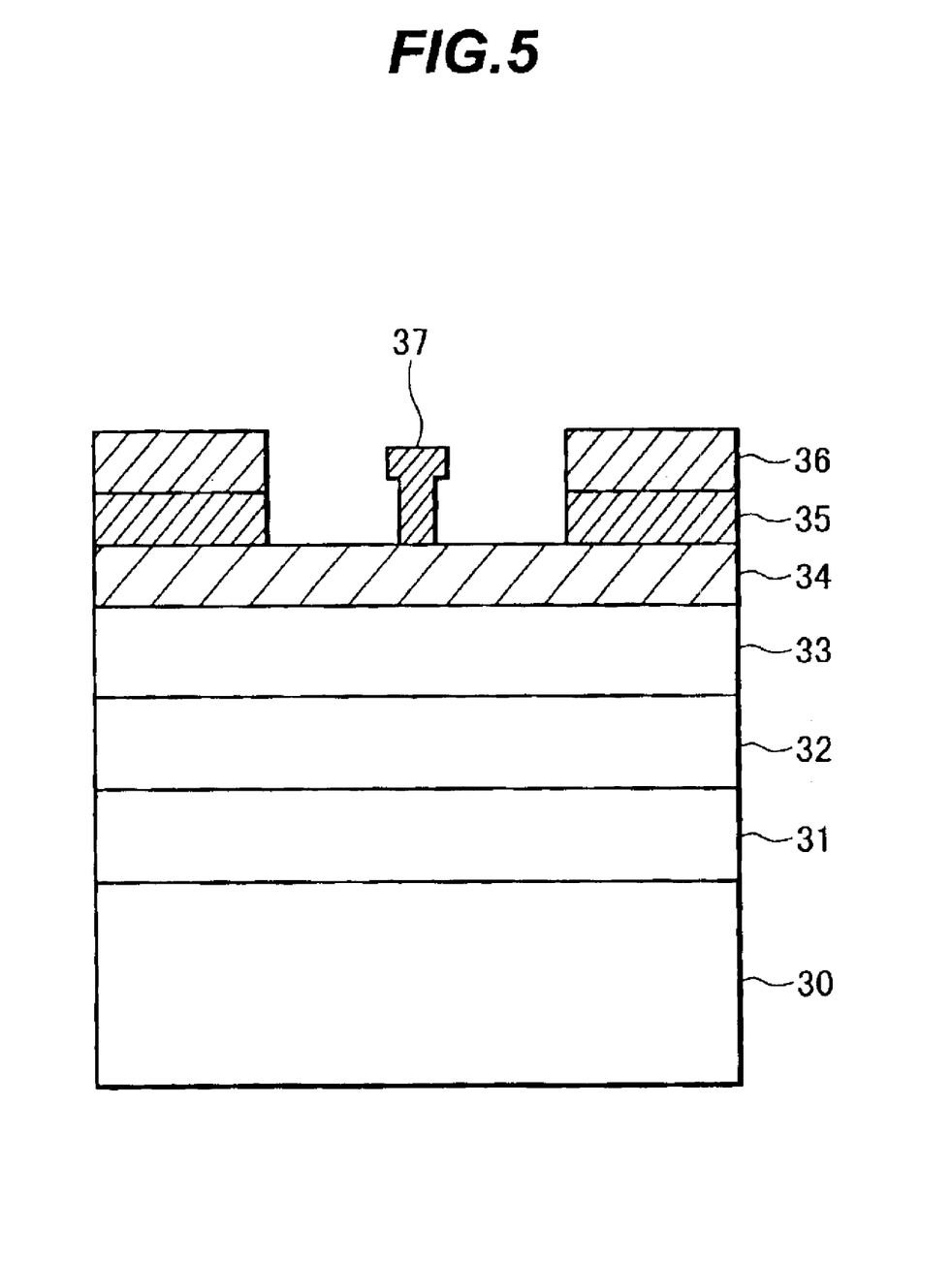
FIG. 5 is a cross sectional view of a HEMT having the structure of the semiconductor device of the second embodiment.

FIG. 5 is a cross sectional view of a high electron mobility transistor (HEMT). On a substrate 30 made of sapphire (Al$_2$O$_3$) or silicon carbide (SiC), a buffer layer 31 of GaN, an underlying layer 32 of undoped GaN, an electron transit layer 33 of undoped AlGaN and an electron supply layer 34 of n-type AlGaN are sequentially formed.

A gate electrode 37 of Pt is in Schottky contact with a partial surface area of the electron supply layer 34. Ohmic electrodes 35 made of erbium silicide are formed on the electron supply layer 34 on both sides of and spaced apart from the gate electrode 37. On each of the ohmic electrodes 35, a cover film 36 of titanium silicide is formed. Two-dimensional electron gas is accumulated at the interface between the electron transit layer 33 and electron supply layer 34.

The electron supply layer 34, ohmic electrode 35 and cover layer 36 correspond to the semiconductor layer 2, ohmic electrode 5 and cover layer 9 shown in FIG. 2B. In HEMT shown in FIG. 5, the contact resistance between the ohmic electrode 35 and electron supply layer 34 can be lowered. The electrical resistance between the ohmic electrode 35 and two-dimensional electron gas accumulated at the interface between the electron transit layer 33 and electron supply layer 34 can be lowered.

Figure 6:
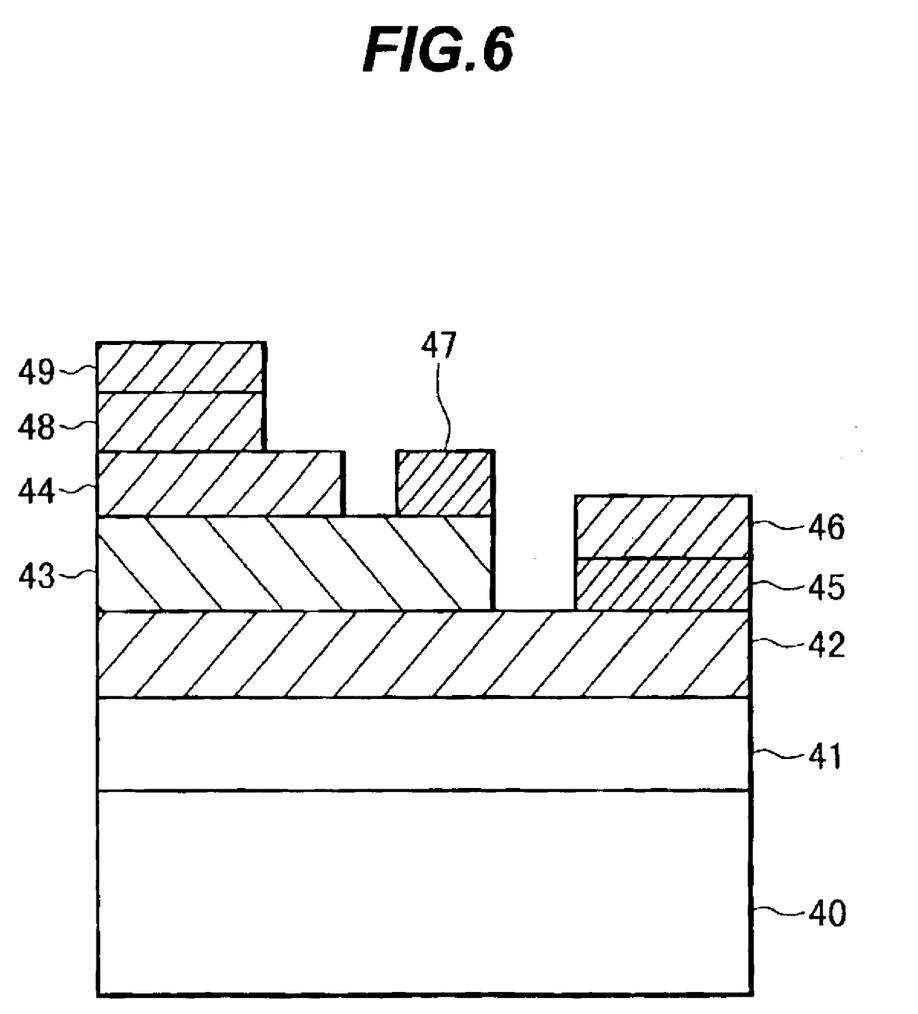
FIG. 6 is a cross sectional view of an HBT having the structure of the semiconductor device of the second embodiment.

FIG. 6 is a cross sectional view of a hetero bipolar transistor (HBT). On a substrate 40 made of sapphire (Al$_2$O$_3$) or silicon carbide (SiC), a buffer layer 41 of GaN, a collector layer 42 of n-type GaN, a base layer 43 of p-type AlGaN and an emitter layer 44 of n-type GaN are sequentially formed. A partial upper surface of the collector layer 42 is exposed and on this exposed surface an ohmic electrode 45 of erbium silicide is formed. On the ohmic electrode 45, a cover film 46 of titanium silicide is formed.

A partial upper surface of the base layer 43 is exposed and on this exposed surface a base electrode 47 having a two-layer structure of Pt (lower layer)/Au (upper layer) or a two-layer structure of Ni (lower layer)/Au (upper layer) is formed. On the emitter layer 44, an ohmic electrode 48 of erbium silicide is formed. On the ohmic electrode 48, a cover film 49 of titanium silicide is formed.

The collector layer 42, ohmic electrode 45 and cover layer 46 correspond to the semiconductor layer 2, ohmic electrode 5 and cover layer 9 shown in FIG. 2B. The emitter layer 44, ohmic electrode 48 and cover layer 49 correspond to the semiconductor layer 2, ohmic electrode 5 and cover layer 9 shown in FIG. 2B. The contact resistance between the ohmic electrode 45 and collector layer 42 and the contact resistance between the ohmic electrode 48 and emitter layer 44 can be lowered.

Figure 7:
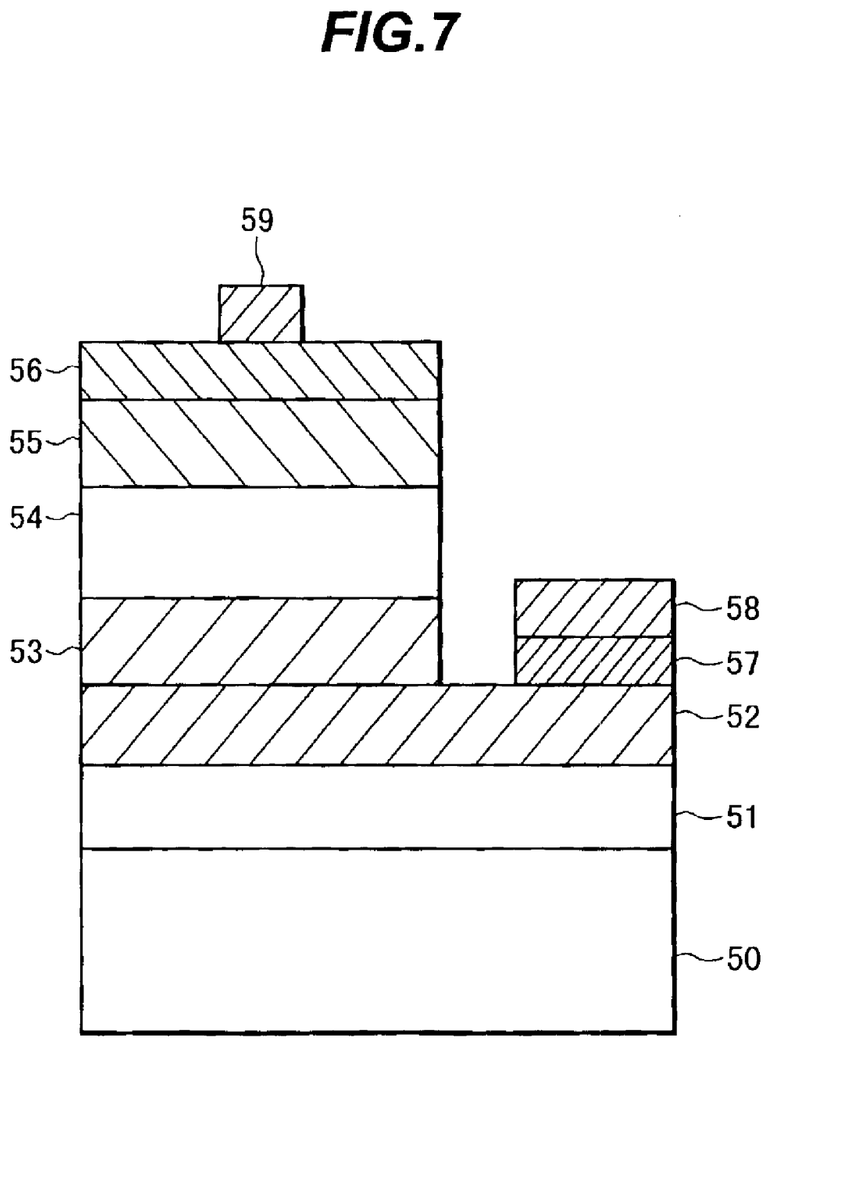
FIG. 7 is a cross sectional view of an LED having the structure of the semiconductor device of the second embodiment.

FIG. 7 is a cross sectional view of a light emission diode (LED). On a substrate 50 made of sapphire (Al$_2$O$_3$) or silicon carbide (SiC), a buffer layer 51 of GaN, an n-type contact layer 52 of n-type GaN, a cathode layer 53 of n-type AlGaN, a light emission layer 54 of undoped InGaN, an anode layer 55 of p-type GaN and a p-type contact layer 56 of p-type GaN are sequentially formed.

A partial upper surface of the n-type contact layer 52 is exposed and on this exposed surface an ohmic electrode 57 of erbium silicide is formed. On the ohmic electrode 57, a cover film 58 of titanium silicide is formed. On a partial surface of the p-type contact layer 56, a p-side electrode 59 is formed which has a two-layer structure of Pt (lower layer)/Au (upper layer) or a two-layer structure of Ni (lower layer)/Au (upper layer) is formed.

The n-type contact layer 52, ohmic electrode 57 and cover layer 58 correspond to the semiconductor layer 2, ohmic electrode 5 and cover layer 9 shown in FIG. 2B. The contact resistance between the ohmic electrode 57 and n-type contact layer 52 can therefore be lowered.

The present invention has been described in connection with the preferred embodiments. The invention is not limited only to the above embodiments. It is apparent that various modifications, improvements, combinations, and the like can be made by those skilled in the art.

What we claim are:

1. A method of manufacturing a semiconductor device, comprising steps of:

forming a first film made of rare-earth metal on a semiconductor region made of compound semiconductor exposed on a substrate;

forming a second film essentially comprising silicon on a surface of said first film; and heating said first and second films to silicidate at least a portion of said first film in contact with said second film;

wherein said silicidating step silicidates a whole thickness of said first film.

2. A method of manufacturing a semiconductor device according to claim 1, wherein said semiconductor region is made of group III–V compound semiconductor comprising nitrogen as a group V element.

3. A method of manufacturing a semiconductor device according to claim 1, wherein said semiconductor region is made of compound semiconductor having a band gap of 3 eV or wider.

4. A method of manufacturing a semiconductor device, comprising steps of:

forming a first film made of rare-earth metal on a semiconductor region made of compound semiconductor exposed on a substrate;

forming a second film essentially comprising silicon on a surface of said first film; and heating said first and second films to silicidate at least a portion of said first film in contact with said second film, further comprising, before said first film is silicidated after said second film is formed, a step of forming a third film on said second film, the third film being made of metal capable of silicidating with silicon and forming metal suicide having a resistivity lower than a resistivity of metal silicide of said first film, wherein said silicidating step silicidates at least a portion of said third film in contact with said second film.

5. A method of manufacturing a semiconductor device comprising steps of:

forming a first film made of rare-earth metal on a semiconductor region made of compound semiconductor exposed on a substrate;

forming a second film essentially comprising silicon on a surface of said first film; and heating said first and second films to silicidate at least a portion of said first film in contact with said second film, wherein said silicidating step performs heat treatment under a condition that silicon atoms in said second film diffuse into said semiconductor region in contact with said first film.

6. A method of manufacturing a semiconductor device according to claim 1, wherein said second film is made of amorphous silicon, and in said silicidating step a heat treatment temperature is set to 400° C. or lower.

7. A method of manufacturing a semiconductor device according to claim 5, wherein said semiconductor region is made of group III–V compound semiconductor comprising nitrogen as a group V element.

8. A method of manufacturing a semiconductor device according to claim 5, wherein said semiconductor region is made of compound semiconductor having a band gap of 3 eV or wider.

9. A method of manufacturing a semiconductor device according to claim 5, wherein said second film is made of amorphous silicon, and in said silicidating step a heat treatment temperature is set to 400° C. or lower.

10. A method of manufacturing a semiconductor device according to claim 4, wherein said semiconductor region is made of group III–V compound semiconductor comprising nitrogen as a group V element.

11. A method of manufacturing a semiconductor device according to claim 4, wherein said semiconductor region is made of compound semiconductor having a band gap of 3 eV or wider.

12. A method of manufacturing a semiconductor device according to claim 4, wherein said second film is made of amorphous silicon, and in said silicidating step a heat treatment temperature is set to 400° C. or lower.

* * * * *